US011866031B2

(12) United States Patent
Dhawan et al.

(10) Patent No.: US 11,866,031 B2
(45) Date of Patent: Jan. 9, 2024

(54) DISCRETIONARY CURRENT INPUT CIRCUIT

(71) Applicant: Deere & Company, Moline, IL (US)

(72) Inventors: Mohit Dhawan, Gurgaon (IN);
Namritha H Shenoy, Cary, NC (US);
Kirk N. Eisenbeis, Cary, NC (US);
Sean M. Kennelly, Holly Springs, NC (US)

(73) Assignee: DEERE & COMPANY, Moline, IL (US)

( * ) Notice: Subject to any disclaimer, the term of this patent is extended or adjusted under 35 U.S.C. 154(b) by 816 days.

(21) Appl. No.: 16/513,207

(22) Filed: Jul. 16, 2019

(65) Prior Publication Data

US 2021/0016768 A1 Jan. 21, 2021

(51) Int. Cl.
*B60W 30/02* (2012.01)
*A01D 34/82* (2006.01)
*H01H 43/00* (2006.01)
*G01R 31/327* (2006.01)
*H02H 3/00* (2006.01)

(52) U.S. Cl.
CPC ........... *B60W 30/02* (2013.01); *A01D 34/828* (2013.01); *G01R 31/3277* (2013.01); *H01H 43/00* (2013.01); *H02H 3/00* (2013.01)

(58) Field of Classification Search
CPC . B60W 30/02; A01D 34/828; G01R 31/3277; H01H 43/00; H01H 9/16; H01H 9/167; H02H 3/00
USPC .......................................................... 307/9.1
See application file for complete search history.

(56) References Cited

U.S. PATENT DOCUMENTS

| 5,155,376 A | 10/1992 | Okano |
| 6,186,260 B1 | 2/2001 | Schenck et al. |
| 6,609,357 B1 | 8/2003 | Davis et al. |
| 6,692,051 B1 | 2/2004 | Cook et al. |
| 7,696,637 B2 * | 4/2010 | Shoemaker ............... H01H 9/54 307/9.1 |
| 10,516,392 B2 * | 12/2019 | Sicard ................... H03K 17/168 |
| 2003/0003522 A1 * | 1/2003 | Goldman ............. G01N 33/725 435/14 |
| 2009/0222905 A1 * | 9/2009 | Choi ................... H04N 21/2541 726/11 |

(Continued)

*Primary Examiner* — Rexford N Barnie
*Assistant Examiner* — Xuan Ly

(57) ABSTRACT

An improved discretionary current input circuit includes a switch sensing an operating condition of a tractor and having a first state if the operating condition is not satisfied and a second state if the operating condition is satisfied, and a microcontroller that deactivates at least one function of the tractor if the switch is in the first state. The switch draws a nominal current except during specified time intervals that are shorter than the time for drawing the nominal current. A power transistor is connected through a diode and resistor to the switch. The power transistor normally is in an off condition, and is powered during the specified time intervals to an on condition to increase current above the nominal current to a threshold through the switch. The microcontroller reads if the switch is in the first state or the second state only during the specified time intervals, and uses a timer circuit to determine a duration of each of the specified time intervals such that the power transistor is turned off before the end of a task interval of the microcontroller.

16 Claims, 5 Drawing Sheets

(56) References Cited

U.S. PATENT DOCUMENTS

2010/0206734 A1* 8/2010 Todd ..................... B22F 9/04
  205/74

* cited by examiner

DISCRETIONARY CURRENT INPUT CIRCUIT

FIELD OF THE INVENTION

This invention relates generally to electrical circuits on tractors, grass mowing machines, and utility vehicles, and more specifically to safety circuits that are used to stop or interrupt power for specified vehicle functions under certain conditions, and controller board inputs that read switches in those circuits.

BACKGROUND OF THE INVENTION

Tractors, grass mowing machines, and utility vehicles may have electrical circuits that stop or interrupt power if an input switch is opened and certain conditions are met. These circuits may be used for safety purposes. For example, one such circuit may stop rotation of cutting blades in the absence of a seated operator.

These circuits typically use low cost, unsealed switches. As a result, water may enter the switch body during vehicle operation. Water entering the switch body may contain fertilizer, organic material, or other dirty contaminants. Empirical tests of switches having water in the switch bodies shows they typically exhibit less than 1000 ohms of resistance, depending on the impurities in the water.

In the past, these circuits have powered relays drawing about 100 mA. The relays have a pull in voltage of about 6 volts, and a drop out voltage of about 1 volt. This provides the relay good hysteresis for input state monitoring. For example, it takes 6 volts at 100 mA to turn on a seat interlock relay. Water in the seat input switch may not provide a false indication (i.e., the switch will not appear closed) unless the resistance drops below about 60 ohms.

More recently, microcontrollers are used instead of relays in these circuits. Several problems may be encountered, as described below.

First, water in the input switch may appear to a microcontroller as a valid switch closure input. This is because a microcontroller in such a circuit may have high impedance inputs, typically about 10K ohms or higher. A 150 ohm resistor placed across each input switch (in order to draw approximately 100 mA at 14.5 volts) must have a continuous rating of 1.5 Watts. However, it is preferable to use resistors rated at about 0.125 Watts.

Second, multiple inputs may continuously dissipate heat into the electronics enclosure, which can be detrimental. For example, mowing machines with multiple inputs may dissipate high wattage (i.e., 20 Watts or more) inside the control enclosure. Due to the heat, component life may be shortened significantly.

Third, if battery voltage is low, a circuit with a microcontroller may sense the input switch as open when the switch is closed. For example, if battery voltage drops to about 5 volts during cold cranking of an engine, a relay may stay energized due to its 1 volt drop out. However, a microcontroller with an input that is voltage based to a 6 volt threshold may stop cranking the engine because it incorrectly senses the input switch is open. Setting the voltage threshold lower can alleviate this problem, but makes the input more sensitive to water in the switch.

Attempts have been made to address the problems described above. For example, an analog to digital converter on each input may be used to evaluate the voltage being returned from the input switch. This is not a preferred solution because it requires costly analog circuits and wiring. Alternatively, some tractors address the problem through use of a positive temperature coefficient thermistor on each input switch to draw higher currents when the switch is first closed, then reduce the current. This also is not an optimal solution, because positive temperature coefficient thermistors are expensive and do not address the problem of an input switch that is properly closed, then opened with water inside it to falsely maintain the circuit. Additionally, the ptc current may be used more as a "cleaning pulse" to remove oxides or corrosion from switch contacts going into high impedance inputs on the controller.

U.S. Pat. No. 7,696,637 assigned to Deere & Company addressed these problems with an input circuit having a power transistor that is normally is in an off condition, and is powered during short intervals to an on condition to increase current to a threshold through the switch. This current is referred to as discretionary current, and the circuit is referred to as a discretionary current input circuit. The discretionary current input circuit includes a power transistor connected through a diode and resistor to the switch or switches sensing various operating conditions of the tractor or vehicle.

Recently, tractors, grass mowing machines, and similar vehicles, are using microcontrollers that run on lower voltages. The microcontrollers have increasingly complex software, and the minimum software task interval forces the power transistor of the discretionary current input circuit to stay on for longer than the required period. This requires a larger, more bulky, resistor R1 that must dissipate more power. A lower value R1 is desirable, but this means the VIL and VIH values for the circuit are closer to each other. An improved, low cost, discretionary input circuit is needed that uses a smaller resistor, handles lower power and enables the microcontroller to correctly and accurately read switch states in wet conditions.

SUMMARY OF THE INVENTION

An improved discretionary current input circuit has a plurality of open body switches connected to at least one normally off power transistor. The switches are movable between open and closed states based on operating characteristics of an off-road vehicle. The switches draw a nominal current except during prescribed time intervals that are shorter than the time for drawing the nominal current. A microcontroller is operably connected to the power transistor and to the switches. The microcontroller turns the power transistor on at prescribed time intervals to provide a current to the switches higher than the nominal current, senses the switch state only during those time intervals; and disables a function of the off-road vehicle if at least one switch is detected in the open state during those time intervals. The time intervals are set to be shorter than a minimum task interval of the microcontroller.

DESCRIPTION OF THE PREFERRED EMBODIMENT

The improved discretionary current input circuit 100 may be included in a tractor, grass mowing machine or off-road utility vehicle. The circuit may include at least one input switch SW, and each switch may depend on one or more operating conditions of the vehicle. Each switch may have two positions; i.e., an open position and a closed position. For example, an input switch may be an operator presence switch that is closed only if an operator is seated, a parking brake switch that is closed if the parking brake is locked, or another switch sensing one or more other vehicle conditions relating to safety or performance. The input switch may be a low-cost, open body switch that may be subject to adverse operating conditions including moisture or wet conditions.

Each switch SW may draw a small amount of nominal current most of the time, and a substantially higher threshold current for short intervals. For example, each switch may draw about 10 to 20 milliamps most of the time, while the threshold current may be about 100 to 200 milliamps for short intervals. The short intervals may be about one millisecond every fifty milliseconds, and may be controlled by the microcontroller, and the improved discretionary current input circuit helps control or limit the timing of those intervals, as will be described in more detail below.

The higher current draw may be accomplished by turning on the power transistor Q1 for short intervals. The power transistor may be normally off and may be connected to each switch SW through diode D1 and 47 ohm resistor R1. Each input switch may be read for the short interval of less than about one millisecond, and then power transistor Q1 may be turned off.

When power transistor Q1 is on, the state of each input switch may be transferred through resistor R2 to an input mask in the microcontroller. The microcontroller also may receive input regarding one or more other operating conditions of the vehicle. The microcontroller may be programmed to provide a signal or signals to activate or deactivate one or more functions of the vehicle, such as stopping rotation of cutting blades or turning off a power take off, if the switch state along with other information satisfies certain specified conditions.

The normally off power transistor may be a bipolar junction transistor (BJT) or field effect transistor (FET) connected through a resistor R1 and diode D1 to each input switch. Alternatively, several power transistors may be used, with one power transistor connected to each input switch.

Figure 1:
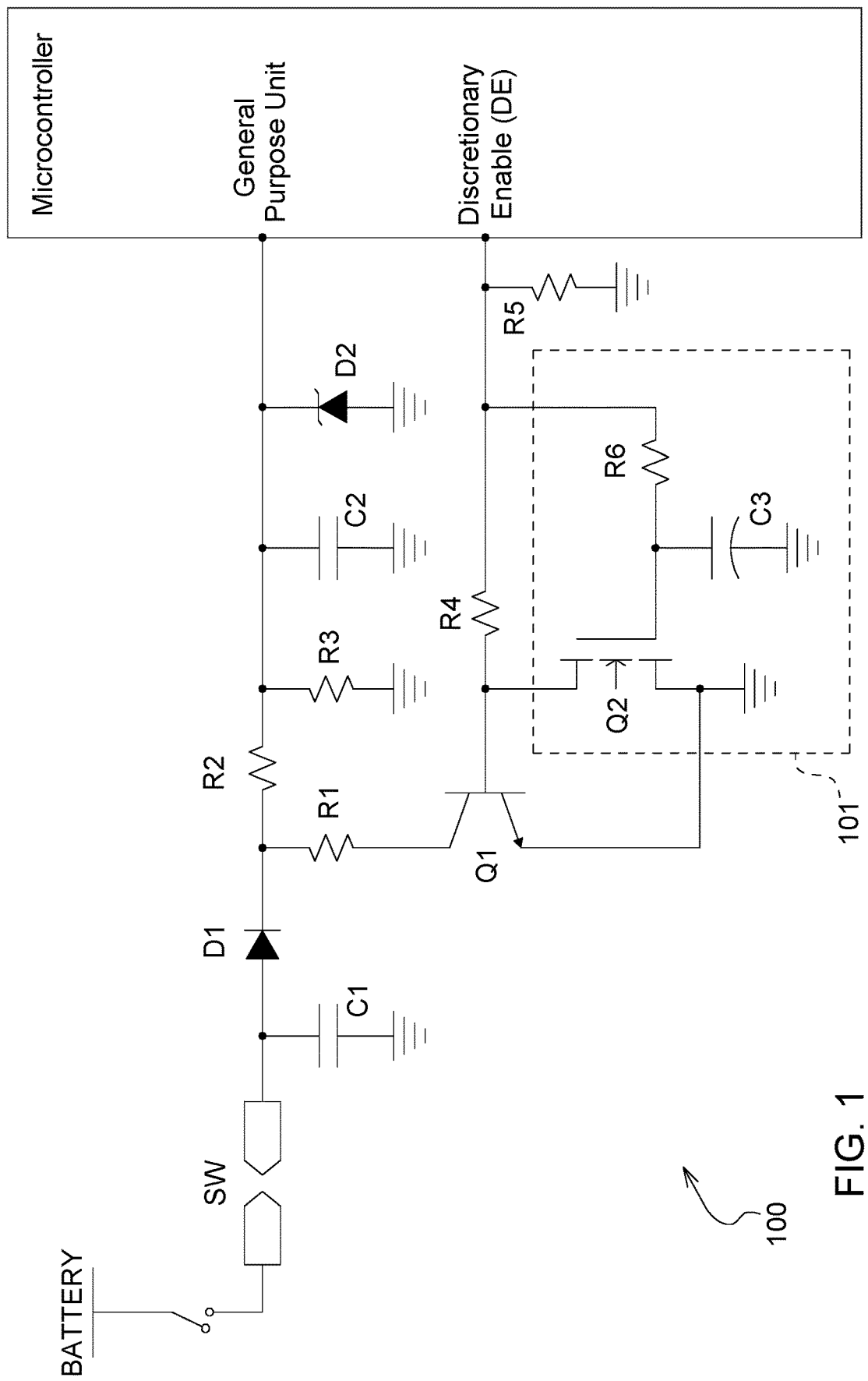
FIG. 1 is a circuit diagram of an improved discretionary current input circuit according to a first embodiment of the invention.
Figure 2:
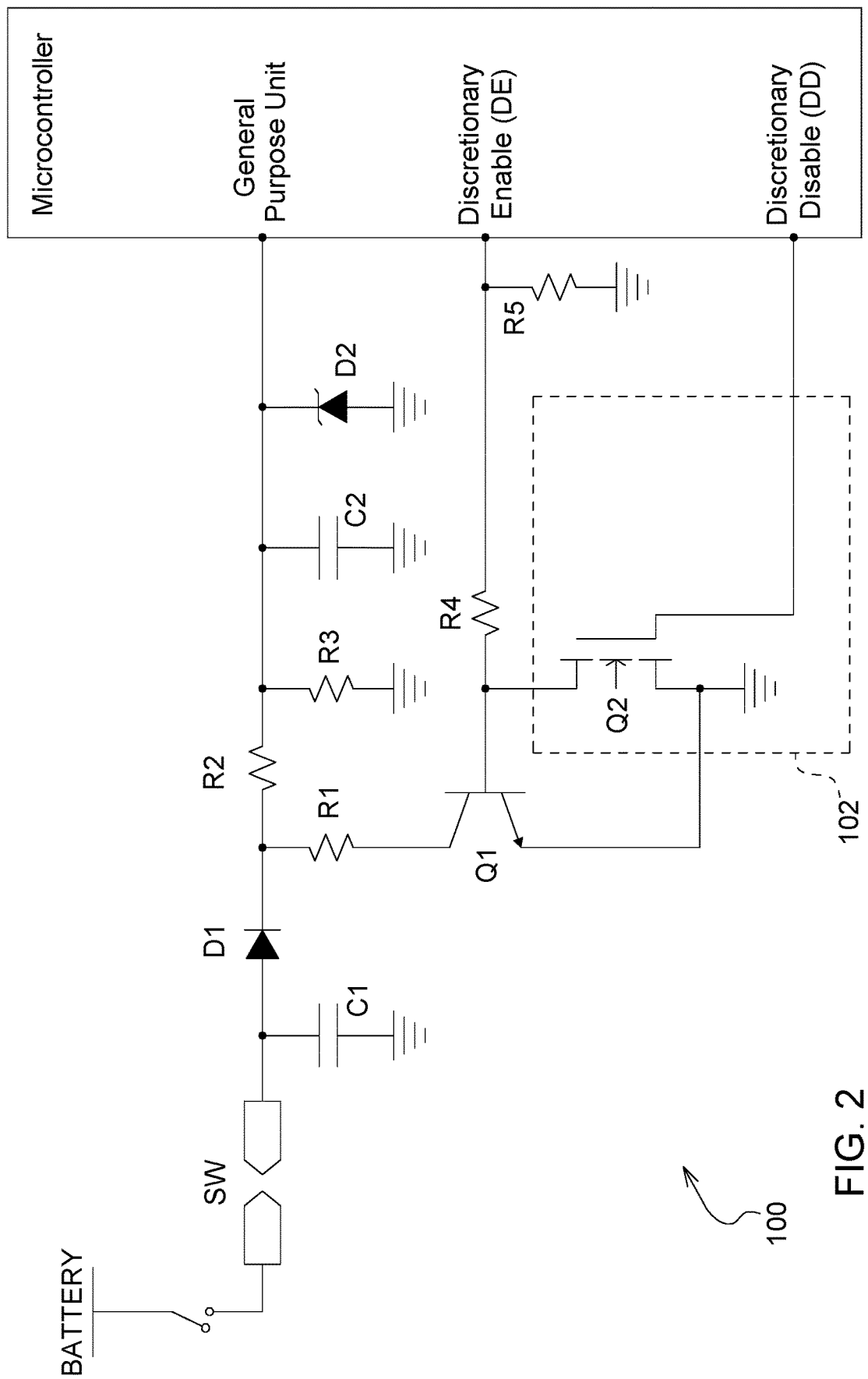
FIG. 2 is a circuit diagram of an improved discretionary current input circuit according to a second embodiment of the invention.
Figure 3:
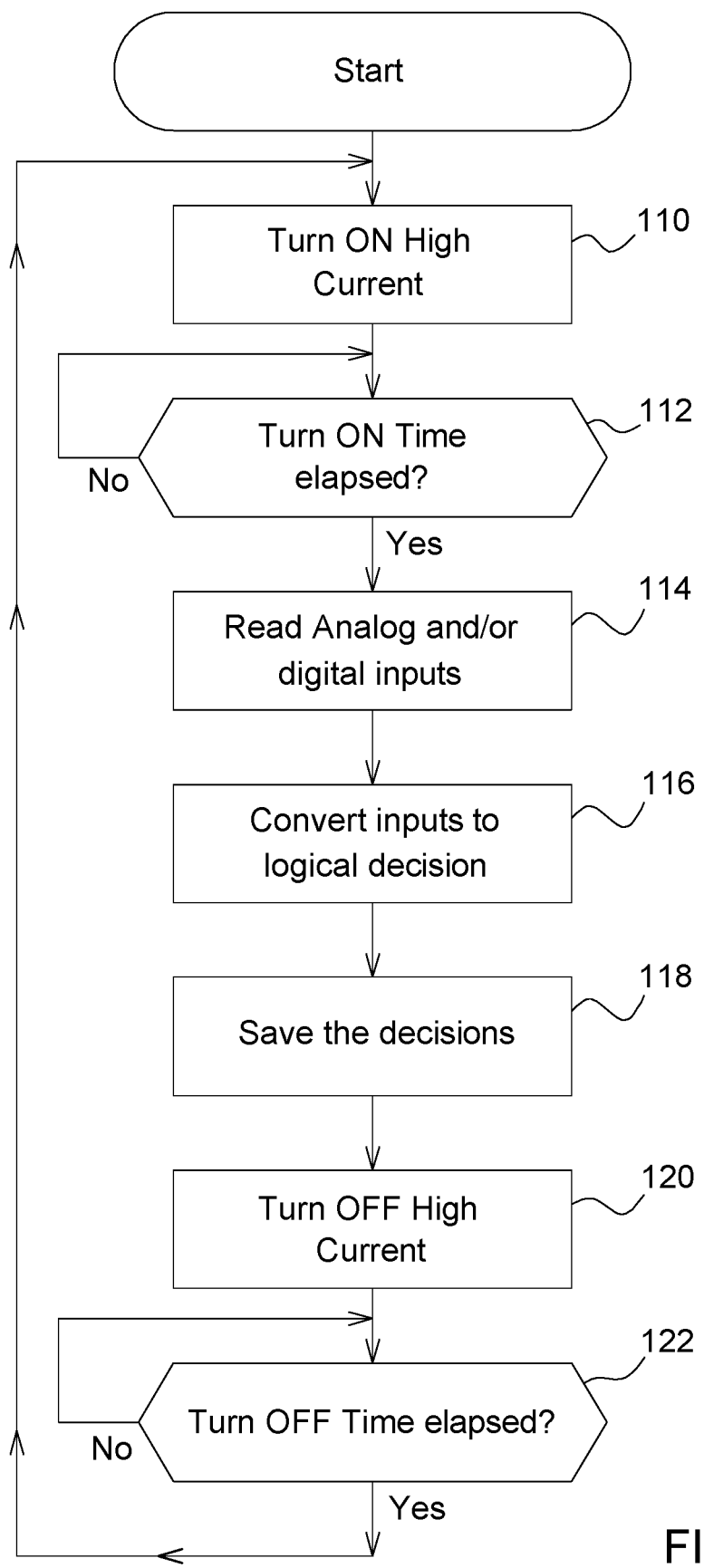
FIG. 3 is a software logic flow diagram for a microcontroller in an improved discretionary current input circuit according to a second embodiment of the invention.

In a first embodiment shown in FIG. 1, improved discretionary current input circuit 100 may include timer circuit 101. The timer circuit may turn off power transistor Q1 after a specified time, to discontinue putting higher current through switch SW. The specified time may be before the end of the task interval of the microcontroller, but long enough to assure that the microcontroller has read the switch state. For example, the timer circuit may include resistor R6 and capacitor C3 having values which define a time constant, along with transistor switch Q2. The Transistor Q2 may be a bipolar junction transistor (BJT) or a field effect transistor (FET). In a second embodiment, improved discretionary current input circuit 100 may include a microcontroller that turns off power transistor Q1 after the microcontroller reads and saves the switch inputs. For example, the microcontroller may use software shown in the logic diagram of FIG. 3. After starting, the microcontroller may turn on the power transistor in block 110. The microcontroller may determine if a specified turn on time has elapsed in block 112. The microcontroller then may read and save the analog and/or digital inputs of switch SW in block 114, convert the inputs to a logical decision in block 116, and save the decisions in memory in block 118. The microcontroller then may turn off the power transistor or high current in block 120. The microcontroller may determine if the turn off time has elapsed in block 122. As shown in FIG. 2, in the second embodiment the microcontroller may include discretionary enable pin DE and discretionary disable pin DD, and the improved discretionary current input circuit may include transistor switch Q2. Alternatively, software may be used to turn on transistor Q2 which will further turn off transistor Q1 as soon as the switch state is read. This will help to discontinue putting higher current through R1.

Figure 4:
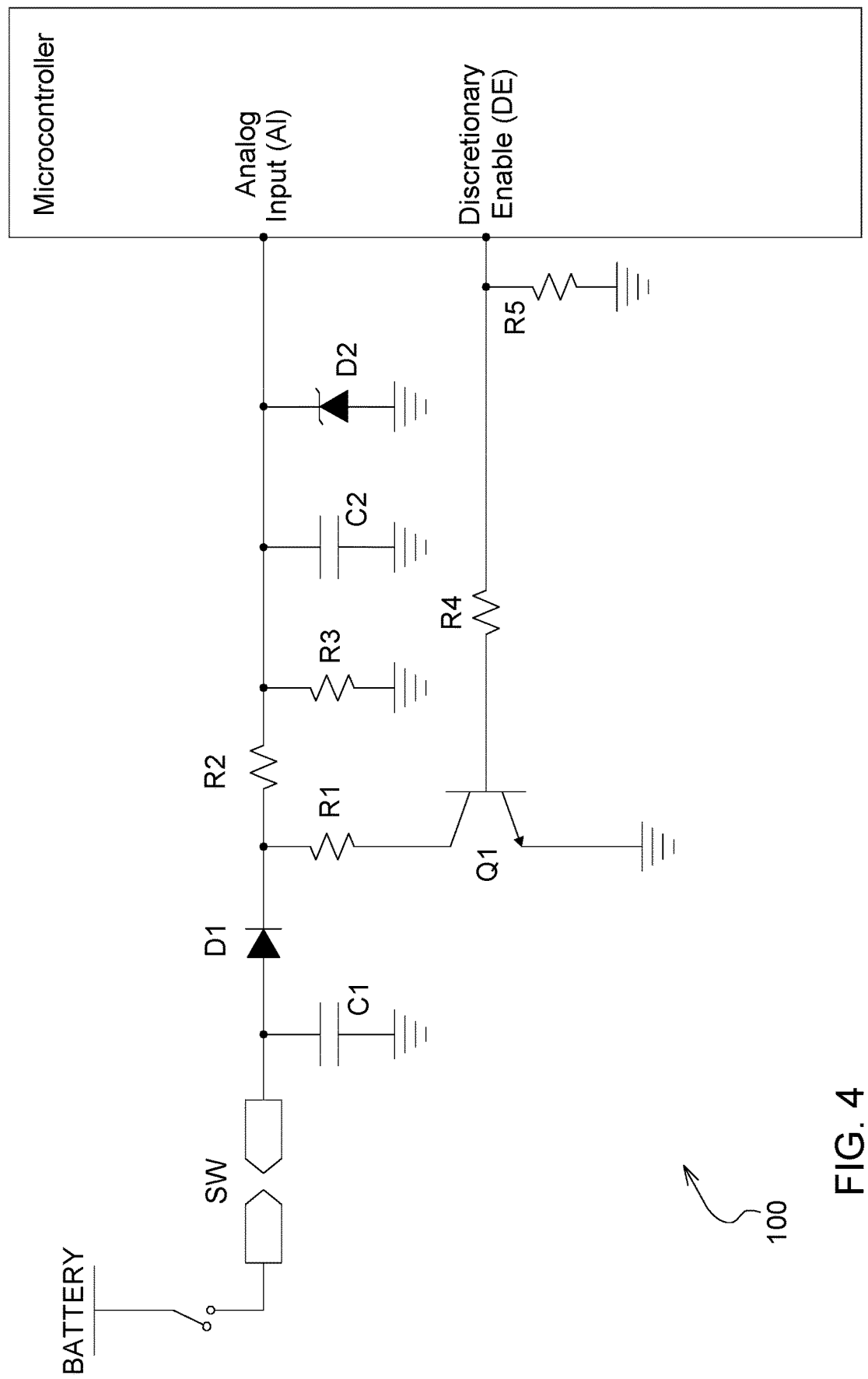
FIG. 4 is a circuit diagram of an improved discretionary current input circuit according to a third embodiment of the invention.
Figure 5:
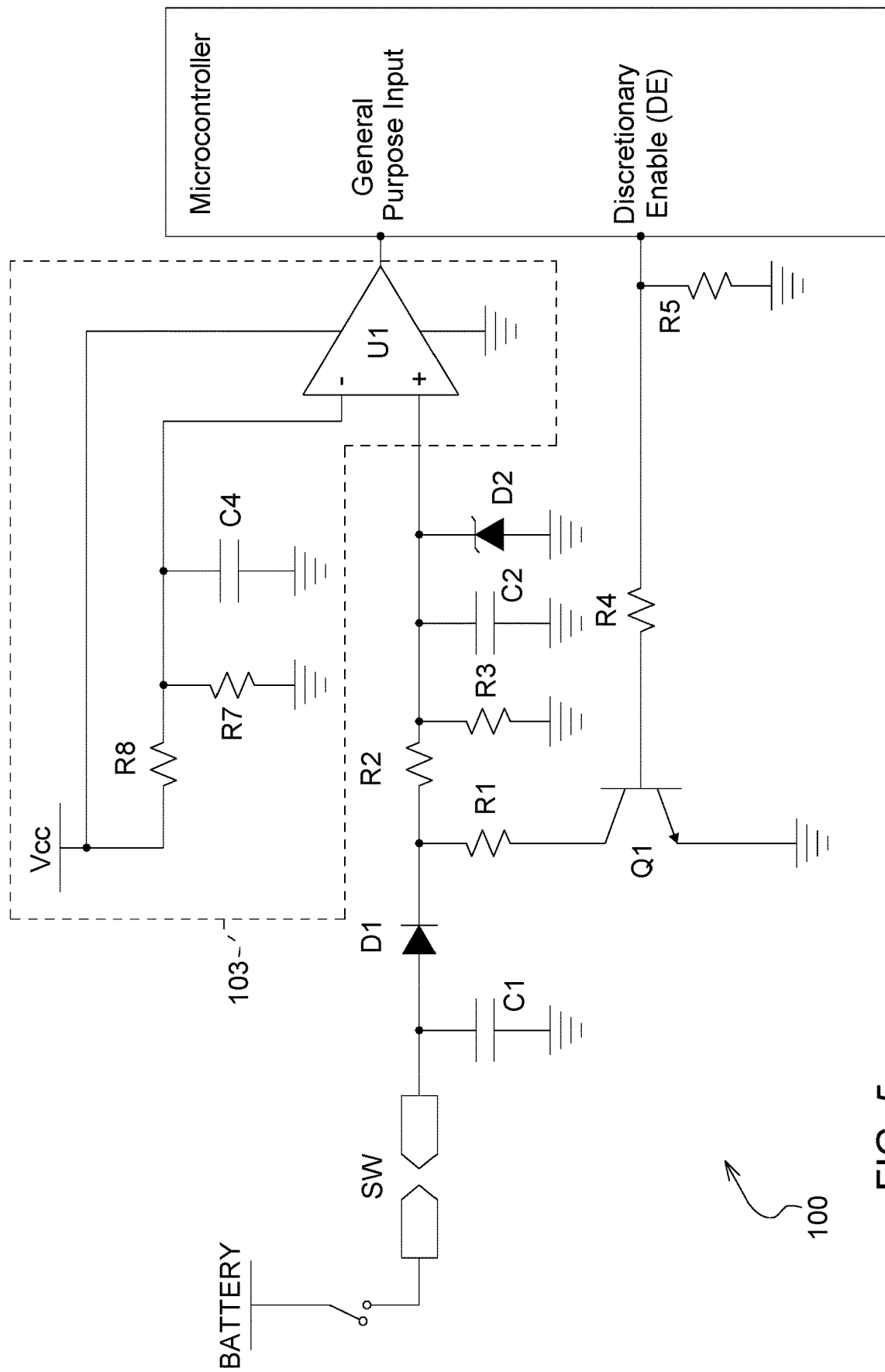
FIG. 5 is a circuit diagram of an improved discretionary current input circuit according to a fourth embodiment of the invention.

The improved discretionary current input circuit also may be used with microcontrollers at lower digital voltage logic levels, such as 3.3V or below. For example, in a third embodiment shown in FIG. 4, improved discretionary current input circuit 100 may be used to interface the switch SW to the microcontroller analog voltage input (AI) instead of the digital voltage input. The analog voltage input (AI) of the microcontroller is referenced to a voltage higher than the digital supply voltage of microcontroller. The microcontroller may read counts at the switch input while Q1 is on along with battery voltage, to estimate the resistance of the switch. Any switch resistance over and above about 300 ohms may be considered as an open switch condition. Alternatively, the improved discretionary current input circuit may include comparator circuit 103 shown in FIG. 5, connected between the divider output and general purpose input 126 of the microcontroller. For example, the improved discretionary current input circuit may include a comparator circuit if analog input to the microcontroller is unavailable. The comparator circuit may include comparator U1, used to compare a stable and predefined reference voltage generated by resistors R8 and R7 along with capacitor C4. Comparator U1 may be powered from the microcontroller digital voltage Vcc.

The improved discretionary current input circuit may include a switch that is connected to the vehicle battery when on and open circuit when off, but the improved discretionary current input circuit also may include a switch that is connected to vehicle ground when on and on and open circuit when off.

Having described the preferred embodiments, it will become apparent that various modifications can be made without departing from the scope of the invention as defined in the accompanying claims.

We claim:
1. An improved discretionary current input circuit comprising:
  an off-road vehicle having a switch sensing an operating condition of the vehicle relating to safety or performance and having a first state if the operating condition is not satisfied and a second state if the operating condition is satisfied;
  a microcontroller to deactivate at least one function of the vehicle if the switch is in the first state; the switch drawing a nominal current except during specified time intervals that are shorter than the time for drawing the nominal current; and a power transistor connected through a diode and resistor to the switch, the power transistor normally being in an off condition, and being powered during the specified time intervals to an on condition to increase current above the nominal current to a threshold through the switch; the microcontroller reading if the switch is in the first state or the second state only during the specified time intervals;

a timer circuit that determines a duration of each specified time interval for sensing the vehicle operating condition such that the power transistor is turned off before the end of a task interval of the microcontroller.

2. The improved discretionary current input circuit of claim 1 further comprising a microcontroller having software that determines the time intervals based on how long the microcontroller takes to read and save the switch inputs.

3. The improved discretionary current input circuit of claim 1 wherein the switch is an operator presence switch.

4. The improved discretionary current input circuit of claim 1 wherein the switch is a parking brake switch.

5. An improved discretionary current input circuit on an off-road vehicle comprising:

a plurality of switches, each switch having an open state and a closed state; the open and closed states based on operating characteristics of the vehicle; each switch drawing a nominal current except during certain time intervals that are shorter than the time for drawing the nominal current;

a power transistor drawing a threshold current higher than the nominal current through the switches during the time intervals;

a microcontroller controlling the time interval length and reading an analog input from each switch only during the time intervals, and providing signals to deactivate at least one function of the vehicle if the analog input from at least one of the switches is outside a predetermined voltage range during the time intervals;

the interval length being less than a minimum task length of the microcontroller.

6. The circuit of claim 5 wherein each of the operating characteristics are safety parameters of the vehicle tractor.

7. The circuit of claim 5 wherein the interval length is about 1 millisecond.

8. The circuit of claim 5 further comprising a plurality of power transistors, with each power transistor connected to one of the switches.

9. The circuit of claim 5 further comprising a diode and a resistor between each switch and the power transistor.

10. An improved discretionary current input circuit comprising:

an off-road vehicle with a circuit having a plurality of open body switches connected to at least one normally off power transistor; the switches movable between open and closed states based on operating characteristics of the off-road vehicle; the switches drawing a nominal current except during prescribed time intervals that are shorter than the time for drawing the nominal current; and a microcontroller operably connected to the power transistor and to the switches; the microcontroller turning the power transistor on at prescribed time intervals to provide a current to the switches higher than the nominal current and sensing the switch state only during those time intervals; and disabling a function of the off-road vehicle if at least one switch is detected in the open state during those time intervals;

the time intervals being set by the microcontroller to be shorter than a minimum task interval of the microcontroller.

11. The improved discretionary current input circuit of claim 10 further comprising a resistor and a diode between each switch and the power transistor.

12. The improved discretionary current input circuit of claim 10 wherein at least one of the switches has a closed state if an operator is sensed on the vehicle.

13. The improved discretionary current input circuit of claim 10 wherein at least one of the switches has a closed state if a parking brake is locked.

14. The improved discretionary current input circuit of claim 10 wherein each switch draws between about 10 milliamps and about 20 milliamps when the power transistor is normally off, and draws between about 100 milliamps and about 200 milliamps when the power transistor is on.

15. The improved discretionary current input circuit of claim 10 further comprising a visible indicator showing if a switch is in the closed state while the switch draws the nominal current or the threshold current.

16. The improved discretionary current input circuit of claim 10 wherein the time intervals are about 1 millisecond every 50 milliseconds.

* * * * *